(12) United States Patent
Divakaruni et al.

(10) Patent No.: US 6,492,211 B1
(45) Date of Patent: Dec. 10, 2002

(54) METHOD FOR NOVEL SOI DRAM BICMOS NPN

(75) Inventors: Ramachandra Divakaruni, Somers, NY (US); Russell J. Houghton, Essex Junction, VT (US); Jack A. Mandelman, Stormville, NY (US); W. David Pricer, Charlotte, VT (US); William R. Tonti, Essex Junction, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/656,819

(22) Filed: Sep. 7, 2000

(51) Int. Cl.[7] .............................................. H01L 21/00
(52) U.S. Cl. ....................... 438/155; 438/234; 257/349
(58) Field of Search ................. 438/155, 234, 438/253, 405, 459; 257/291, 347–349, 390

(56) References Cited

U.S. PATENT DOCUMENTS

| | | |
|---|---|---|
| 4,604,534 A | 8/1986 | Pricer |
| 4,922,318 A | 5/1990 | Thomas et al. |
| 4,962,052 A | 10/1990 | Asayama et al. |
| 5,017,995 A | 5/1991 | Soejima |
| 5,021,852 A | 6/1991 | Sukegawa et al. |
| 5,087,580 A | 2/1992 | Eklund |
| 5,121,185 A | 6/1992 | Tamba et al. |
| 5,164,326 A | 11/1992 | Foerstner et al. |
| 5,172,340 A | 12/1992 | Leforestier et al. |
| 5,229,967 A | 7/1993 | Nogle et al. |
| 5,239,506 A | 8/1993 | Dachtera et al. |
| 5,343,428 A | 8/1994 | Pilo et al. |
| 5,440,161 A * | 8/1995 | Iwamatsu et al. ........... 257/349 |
| 5,444,285 A | 8/1995 | Robinson et al. |
| 5,483,483 A | 1/1996 | Choi et al. |
| 5,547,893 A | 8/1996 | Sung |
| 5,576,572 A | 11/1996 | Maeda et al. |
| 5,760,626 A | 6/1998 | Pelley, III |
| 5,789,285 A | 8/1998 | Yoshihara |
| 5,888,861 A | 3/1999 | Chien et al. |
| 5,894,233 A | 4/1999 | Yoon |
| 5,909,400 A | 6/1999 | Bertin et al. |

FOREIGN PATENT DOCUMENTS

JP 63-207172 8/1988

* cited by examiner

*Primary Examiner*—David Nelms
*Assistant Examiner*—Dung A Le
(74) *Attorney, Agent, or Firm*—Mark F. Chadurjian; Eugene I. Shkurko; F. William McLaughlin

(57) ABSTRACT

There is disclosed herein a unique fabrication sequence and the structure of a vertical silicon on insulator (SOI) bipolar transistor integrated into a typical DRAM trench process sequence. A DRAM array utilizing an NFET allows for an integrated bipolar NPN sequence. Similarly, a vertical bipolar PNP device is implemented by changing the array transistor to a PFET. Particularly, a BICMOS device is fabricated in SOI. The bipolar emitter contacts and CMOS diffusion contacts are formed simultaneously of polysilicon plugs. The CMOS diffusion contact is the plug contact from bitline to storage node of a memory cell.

12 Claims, 9 Drawing Sheets

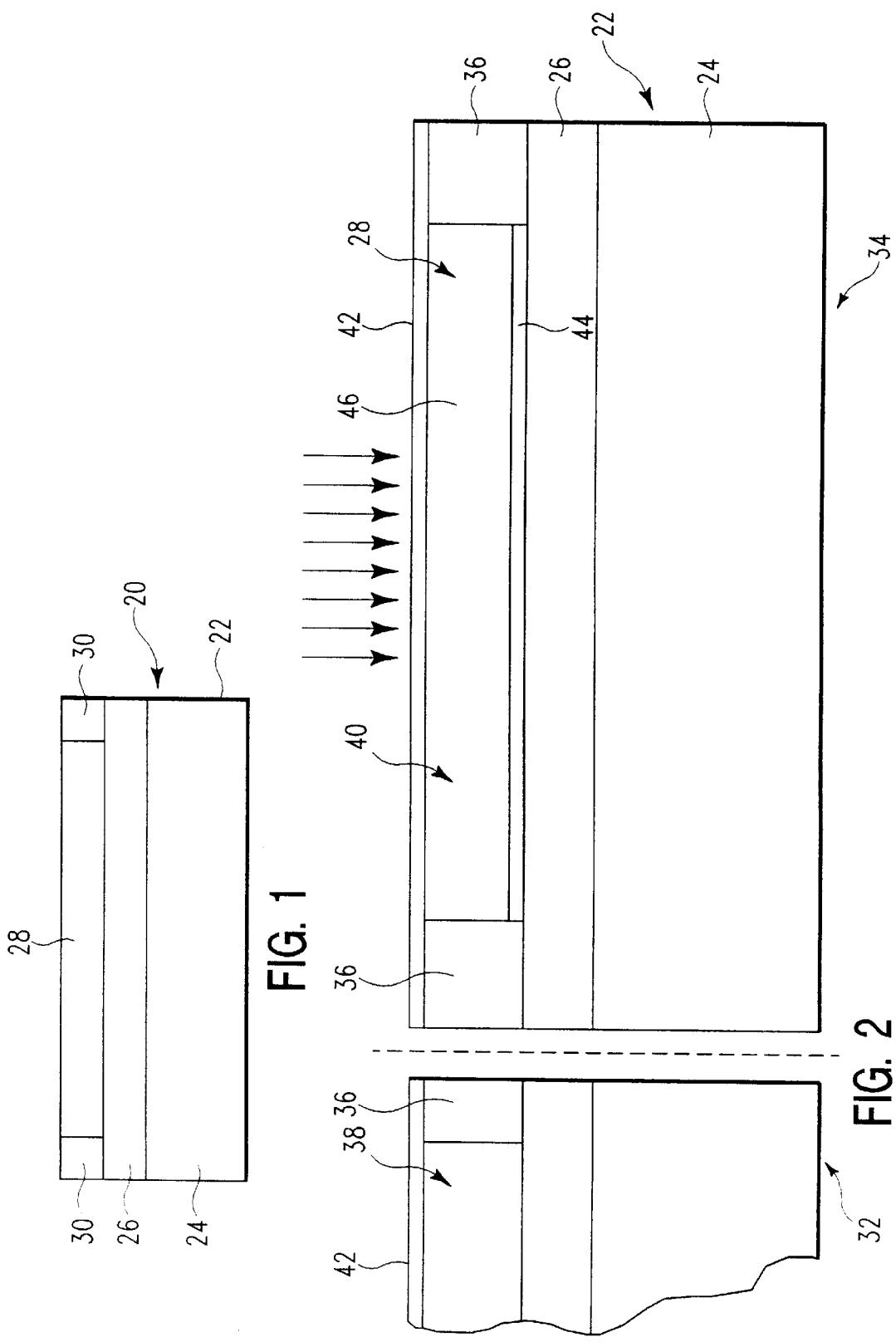

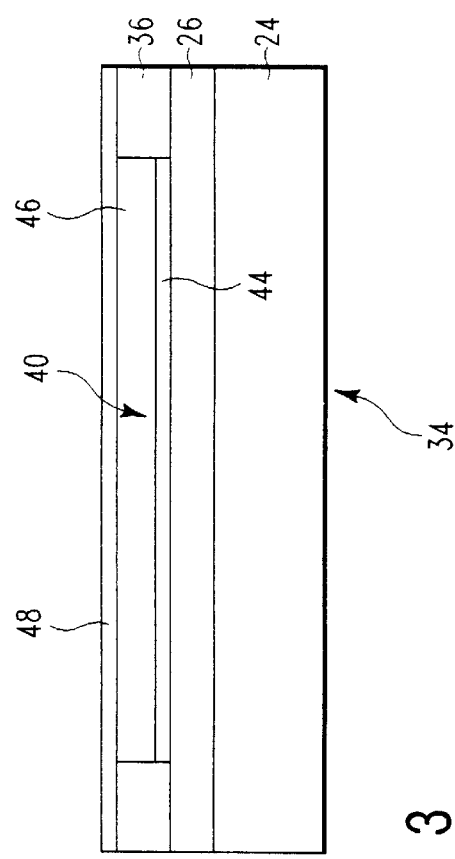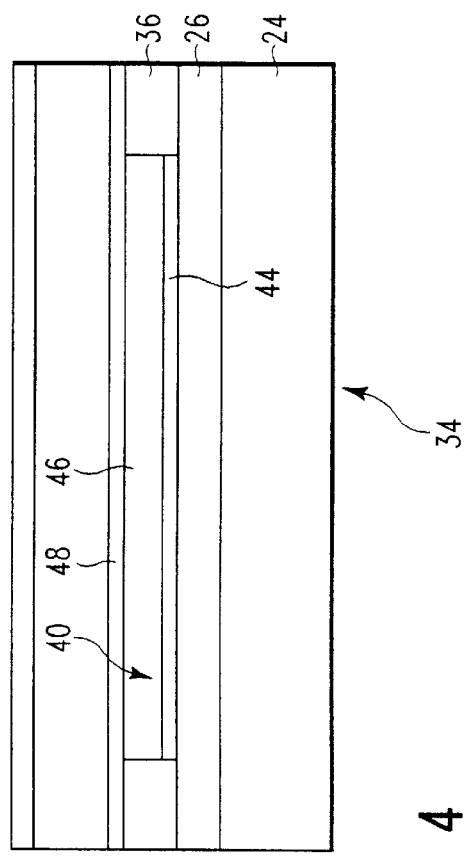
FIG. 3
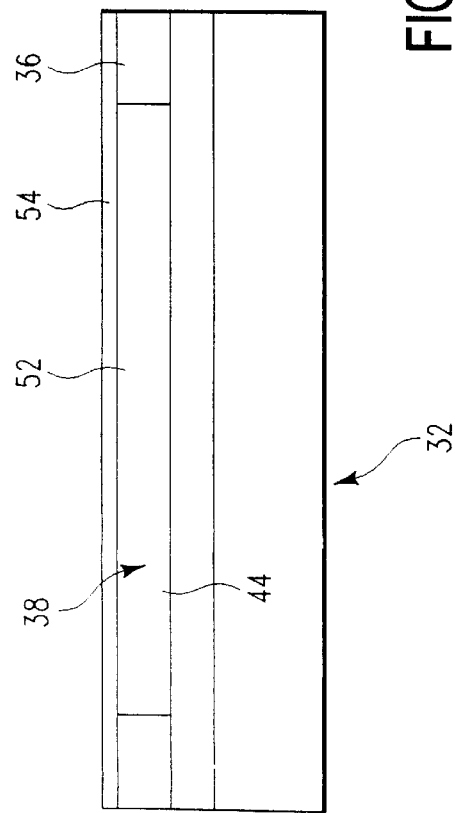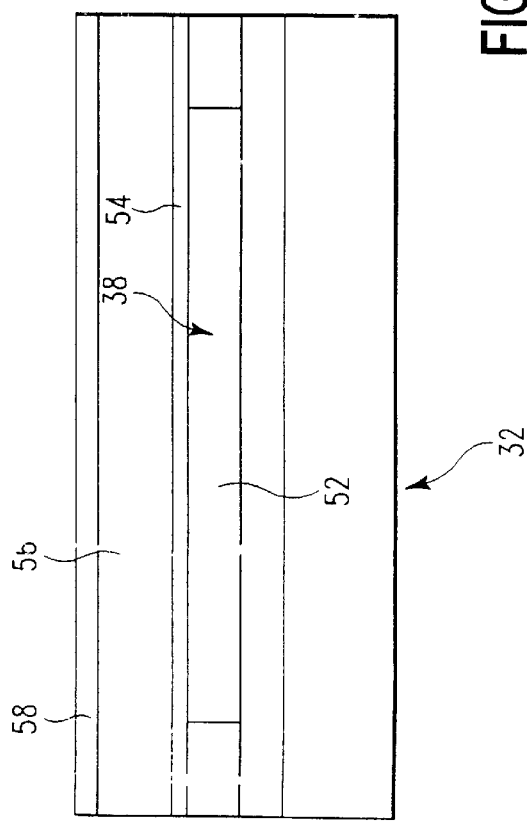
FIG. 4

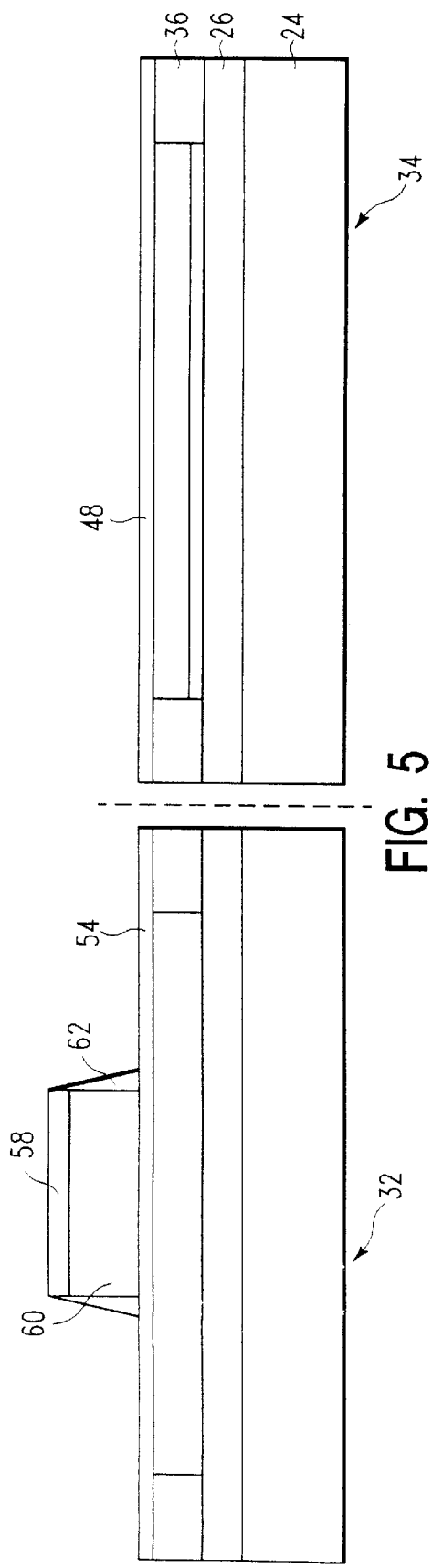
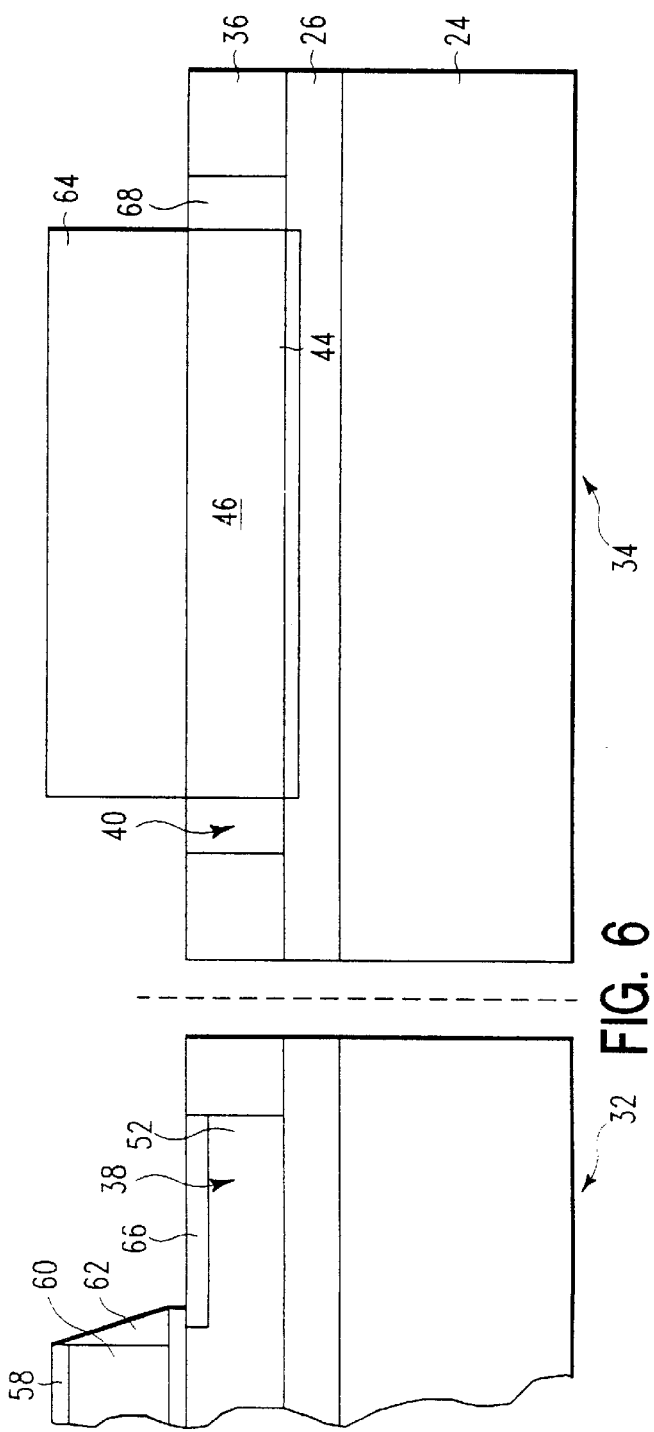
FIG. 5
FIG. 6

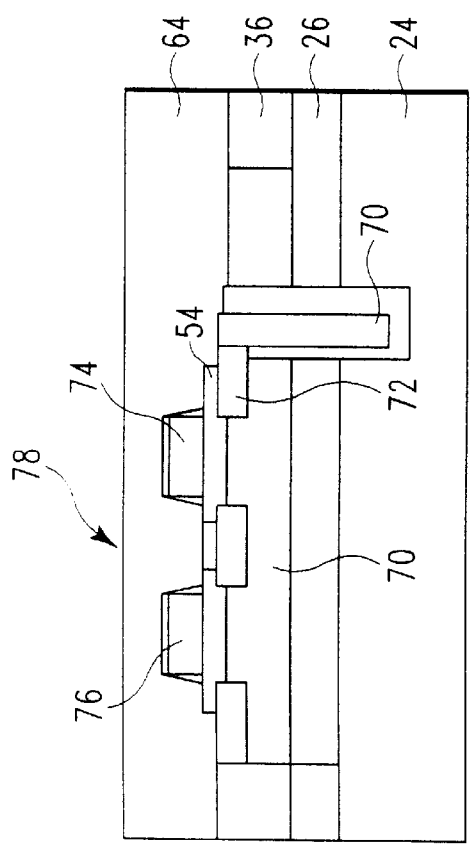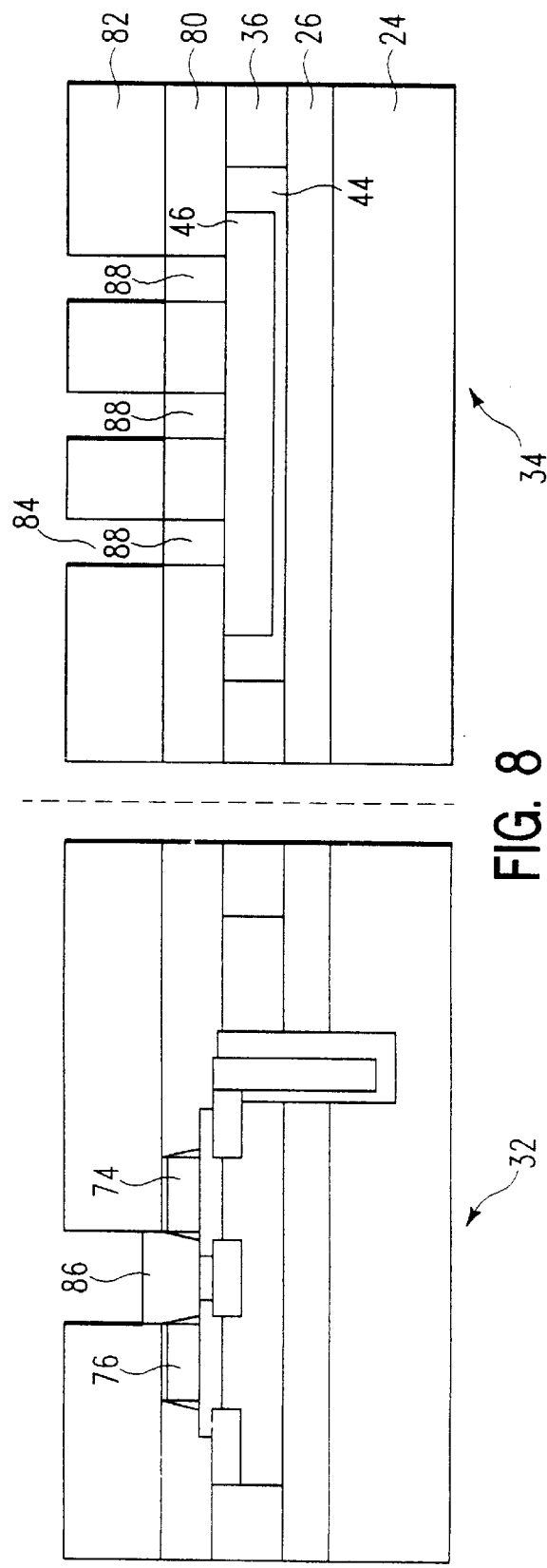
FIG. 7
FIG. 8

METHOD FOR NOVEL SOI DRAM BICMOS NPN

FIELD OF THE INVENTION

This invention relates to semiconductor devices and, more particularly, to a structure and method for novel silicon on oxide structure having both bipolar and CMOS devices.

BACKGROUND OF THE INVENTION

Integrated semiconductor circuits, particularly memory circuits employing cells which include a storage capacitor and a single switch, such as dynamic random access memories (DRAM), have achieved high memory cell densities. These cells employ a storage capacitor and a field effect transistor (FET) acting as a switch to selectively connect the capacitor to a bit/sense line.

Silicon on insulator (SOI) in semiconductor devices provides a high performance regime for CMOS operation due to its unique isolation structure. Advantageously, a complementary pair of bipolar devices within the CMOS framework are integrated for low voltage, high performance operation. Such integration is referred to a BICMOS technology. Advantageously, the BICMOS technology will make use of as much of the CMOS advantages as possible.

The present invention is directed to further improvements in BICMOS technology and to improvements in dynamic drive sense amplifiers.

SUMMARY OF THE INVENTION

In accordance with-the invention, a unique fabrication sequence is provided and the structure of a vertical silicon on insulator (SOI) bipolar transistor integrated into a typical DRAM trench process sequence. A DRAM array utilizing an NFET allows for an integrated bipolar NPN sequence. Similarly, a vertical bipolar PNP device is implemented by changing the array transistor to a PFET.

In accordance with another aspect of the invention, a dynamic drive sense amplifier is enabled by the novel structure. This novel dynamic drive sense amplifier provides a solution for sensing low level signals in a low voltage environment.

In one aspect of the invention there is disclosed a BICMOS device fabricated in SOI. The bipolar emitter contacts and CMOS diffusion contacts are formed simultaneously of polysilicon plugs. The CMOS diffusion contact is the plug contact from bitline to storage node of a memory cell.

There is disclosed in accordance with another aspect of the invention a circuit for a dynamic drive sense amplifier. The circuit includes a preamplifier using NPN transistors cross-coupled with NMOS switches. A CMOS latch is connected in parallel controlled by separate control signals and operated in a second bitline drive phase. The preamplifier is biased by a displacement current from a MOS capacitor.

Further features and advantages of the invention will be readily apparent from the specification and from the drawings.

BRIEF DESCRIPTION OF THE DRAWINGS

FIG. 1 is a sectional view of a semiconductor wafer for processing array and bipolar areas on silicon on insulator (SOI) substrate forming array devices and bipolar devices on the SOI substrate in accordance with the invention;

FIGS. 2–9 are partial sectional views of the wafer of FIG. 1 sequentially illustrating the simultaneous processing in accordance with the invention;

DETAILED DESCRIPTION OF THE INVENTION

Figure 9:
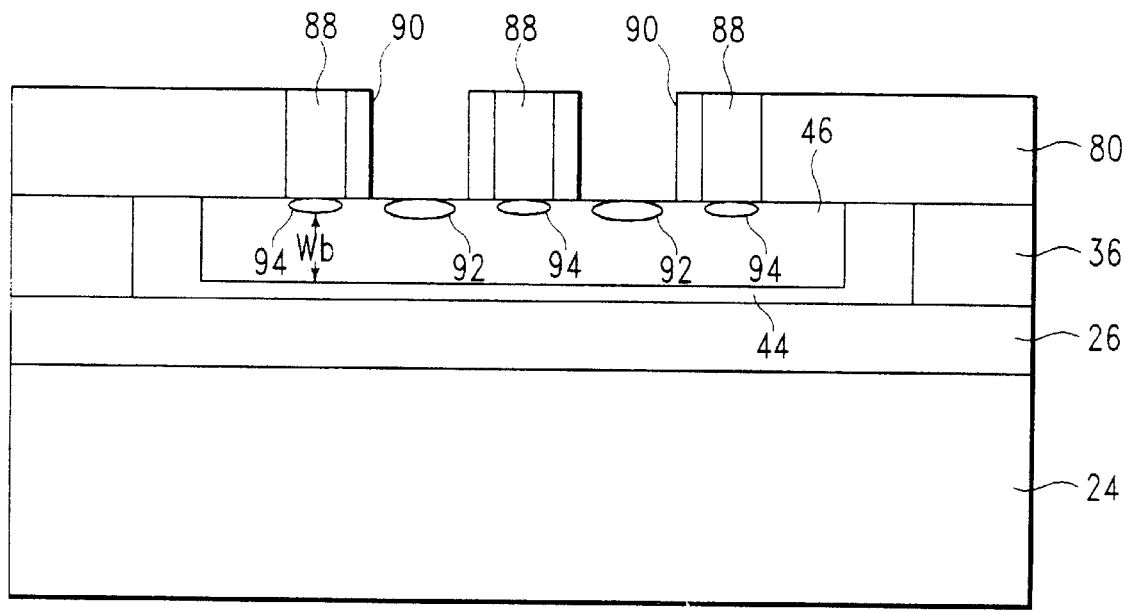

Referring initially to FIG. 1, a semiconductor wafer 20 in a starting condition is illustrated. The wafer 20 is processed using a method of simultaneously processing array and bipolar areas on a silicon on insulator (SOI) substrate 22 for forming array devices and bipolar devices thereon. The substrate 22 includes a lower bulk silicon layer 24. A layer of back oxide 26 overlays the bulk silicon 24. The active silicon layer 28 overlays the back oxide layer 26. The active silicon layer 28 is surrounded by an isolation region 30 formed using conventional shallow trench isolation techniques.

Referring to FIG. 2, conventional processing techniques are used to form array or DRAM regions, one of which is illustrated at 32, and bipolar regions, one. of which is illustrated at 34. The regions 32 and 34 are shown separated by a vertical dashed line. However, as is apparent, the regions 32 and 34 are provided on the same wafer 20, see FIG. 1. The regions 32 and 34 are separated by isolation regions 36.

FIG. 2 specifically illustrates the steps for defining collector and base in the substrate 22. The isolation regions 36 separate the active silicon layer 28 into array silicon 38 in the DRAM region 32 and bipolar silicon 40 in the bipolar region 34. A MOSFET sacrificial oxide layer 42 masks the DRAM region 32 and the bipolar region 34 to prepare vertical NPN bipolar base and collector. For the N+ collector layer, antimony (Sb) has been found to be a suitable N+ type impurity because its relatively low diffusivity and small implant straggle enable the buried N+ layer to be confined to near the back interface of the top active silicon layer 28. An SOI layer having a thickness of 400 nm is used with an Sb implant of $1\times10^6$ cm-2 @ 1 MeV. This produces the N+ collector layer 44. This results in a buried collector layer 44 centered at approximately the back interface with a peak concentration of approximately $3\times10^{19}$ cm-3. The base 46 is implanted using boron fluoride ($BF_2$). Having the collector and base profiles vertically stacked results in an extremely narrow base width, and a collector junction which terminates on the back oxide 26 of the SOI layer 22, meeting device design objectives for high performance, i.e., low collector to substrate capacitance.

Subsequently, the screen oxide layer 42 is removed. A nitride layer 48 is deposited in the bipolar region 34, see FIG. 3. In the DRAM region 32, isolation regions are formed using a gate oxide screen (not shown). A dopant is implanted into the array silicon 38. The type of dopant depends on whether the processing of active region 38 results in forming P-well, for an NFET, or an N-well, for a PFET, o an array transistor well. A gate oxide dielectric layer 54 is then formed on the active region 38.

Referring to FIG. 4, a gate layer 56 is simultaneously formed over the array silicon 38 and the bipolar silicon 40. The gate layer 56 in the illustrated embodiment of the invention comprises N+ polysilicon which is deposited in both,DRAM regions 32 and bipolar regions 34. A nitride cap layer 58 is deposited over the gate layer 56. The cap layer 58 is thicker than the nitride layer 48 in the bipolar region 34. The polysilicon stack, comprising the gate layer 56 and cap layer 58, is etched by patterning polysilicon gates over the DRAM region 32 and etching the entire bipolar region 34. This removes the gate layer 56 and cap layer 58 from the bipolar region 34, as shown in FIG. 5. This also results in etching gates 60 of the N+ polysilicon over isolated regions in the DRAM area 32. The cap remains on the gate 60. Side wall spacers 62 are then formed on the gates 60, as shown in FIG. 5.

In the DRAM region 32, there may be array gates, PFET supports, NFET supports, as is well known.

Referring to FIG. 6, the processing for collector reach through doping and N+ source drain doping are illustrated. Initially, the nitride cap blocking layer 48 is stripped from over the bipolar region 34. A portion of the bipolar silicon 40 is masked using a mask 64. An N+ type dopant is simultaneously implanted into the array silicon 38 that is not blocked by the gate 60 and side wall spacer 62 for forming diffusing regions 66 on opposite sides of the gate 60. The N+ dopant is also implanted into the bipolar silicon 40 that is not masked for forming collector contacts 68 in the bipolar silicon 40. The N+ junction is shallower than the SOI active layer, but links to the buried subcollector 44 for the bipolar region 34.

FIG. 6 illustrates processing in the DRAM region 32 for a support NFET device. FIG. 7 illustrates processing for a DRAM transfer device. This includes a DRAM storage node 70 processed prior to the processing discussed above relative to FIG. 1. A DRAM well 72 is typically different from the NFET support devices. A DRAM junction 72 is typically lower doped than N+ support junctions. This is defined by a separate mask (not shown). The gate processing discussed above is used to form an active word line 74 and a passing word line 76. These are covered by the mask 64. A future bitline 78 is disposed between the active word line 74 and the passing word line 76.

Referring to FIG. 8, the processing for the array bitline and N+ polyplug emitter are described. An inter level dielectric (ILD) insulator layer 80 is deposited over the entire wafer and etched for bitline array contact and emitter poly using a mask 82. In the DRAM region 32 the bitline is defined by the word lines 74 and 76 and spacers. In the bipolar region 34 the emitter is defined by the ILD etching as at openings 84. N+ polysilicon is then deposited to form the array bitline 86 in the DRAM regions 32 and plural emitter plugs 88 in the bipolar region 34.

Referring to FIG. 9, formation of the P+ base contacts in the bipolar region 34 as initially discussed. Although not shown, the array devices and NFET supports are blocked in the array regions 32. The ILD layer 82 is etched between the emitter plugs 88, as shown at openings 90. P+ type dopant is implanted through the openings 90 into the base layer 46 for forming base contacts 92. Simultaneously, the P+ dopant is implanted into the array silicon for support PFETs devices for diffusing opposite regions on opposite sides of the gate layer (not shown). This is generally similar to forming the N+ diffusion regions 66 in FIG. 6 for the NFET support devices.

The junctions are activated by thermal annealing so that the polysilicon in the emitter plugs 88 diffuses into the base layer 46 to form emitter junctions 94. This anneal forms the emitter junction by diffusing the N+ dopant from the plug 88,into the base layer 46. This sets the base width Wb. Thus, having the collector and base profiles vertically stacked results in an extremely narrow base with Wb, and a collector junction which terminates on the back oxide of the SOI layer, meeting the device design objectives for high performance.

Figure 10:
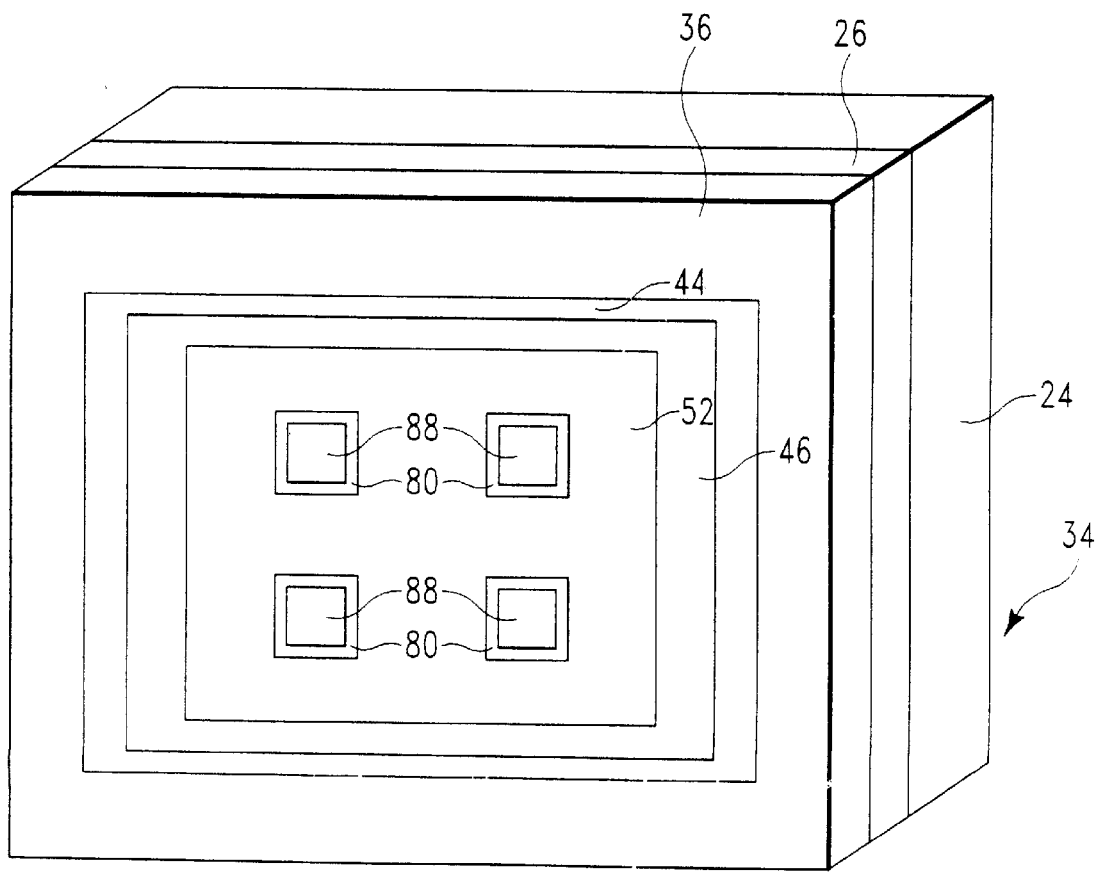
FIG. 10 is a partial perspective view of a bipolar region formed using the processing of FIGS. 2–9.

The resulting structure is illustrated in FIG. 10 for a four emitter device. The ILD 80 surrounds the emitter plugs 88 but is otherwise removed to expose the collector 44 and base 46 as is shown.

The above processing in the bipolar regions is described relative to forming an NPN transistor. As is apparent, similar processing steps could be used for forming a PNP transistor, as will be apparent. For example, the collector reach through for a PNP transistor would be done simultaneously with implanting P+ dopant for PFET devices.

Figure 12:
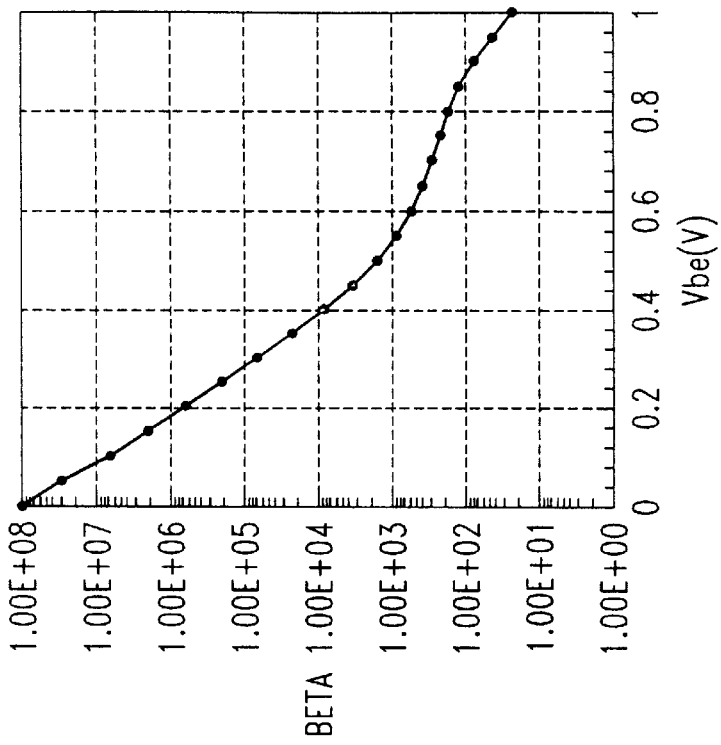
FIG. 12 is a curve illustrating expected DC performance for the device of FIG. 10.
Figure 11:
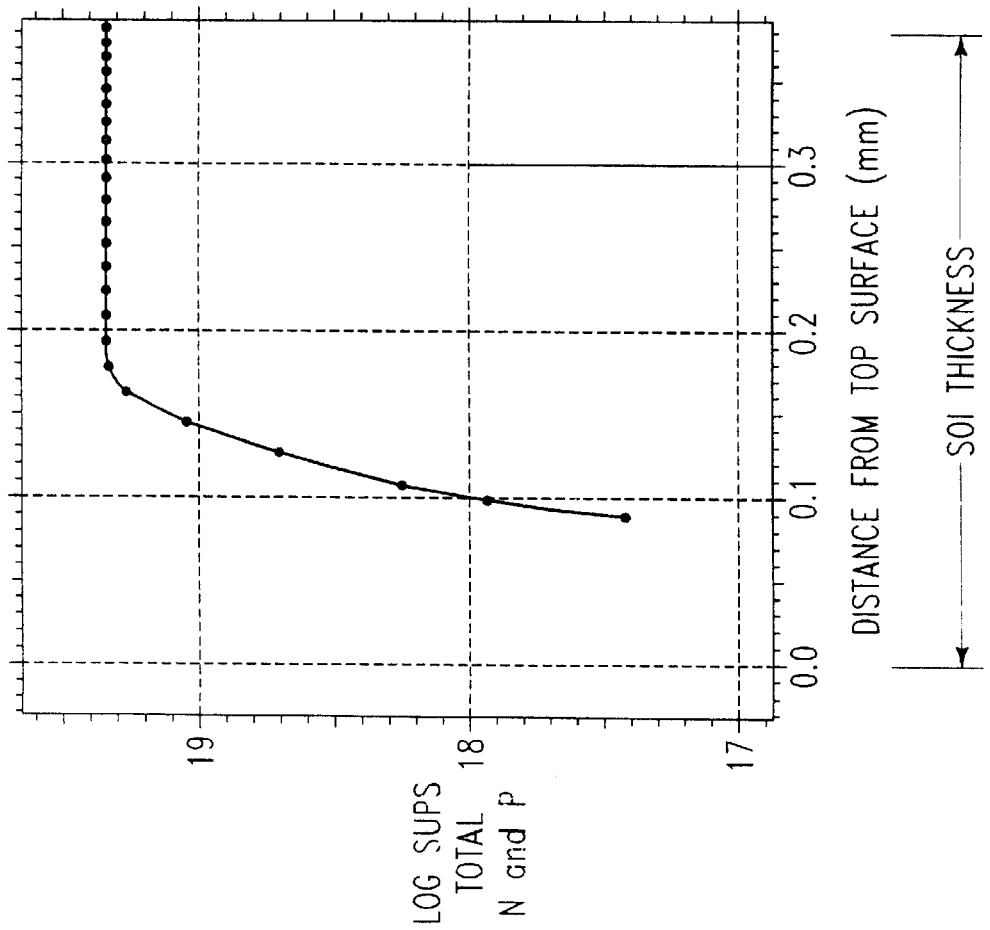
FIG. 11 is a curve illustrating simulation results for collector dopant profile of the device shown in FIG. 10.

The collector doping profile and expected DC performance of the device described above is illustrated in FIGS. 11 and 12. Particularly, FIG. 11 illustrates collector doping profile relative to SOI thickness. The curve of FIG. 12 illustrates the DC beta, representing collector current over base current gain, relative to Vbe. These curves indicate a high performance bipolar device that can be fabricated within the constraints of DRAM SOI processing. It is also possible to thicken the bipolar SOI region by either growing/ depositing selected silicon over this area, or by using a mask and oxygen implant energy to alter the depth of the buried oxide layer, thus providing additional leverage for base width control.

The novel processing sequence described above enables an improved dynamic drive sense amplifier that provides for sensing low level signals in a low level environment.

Figure 13:
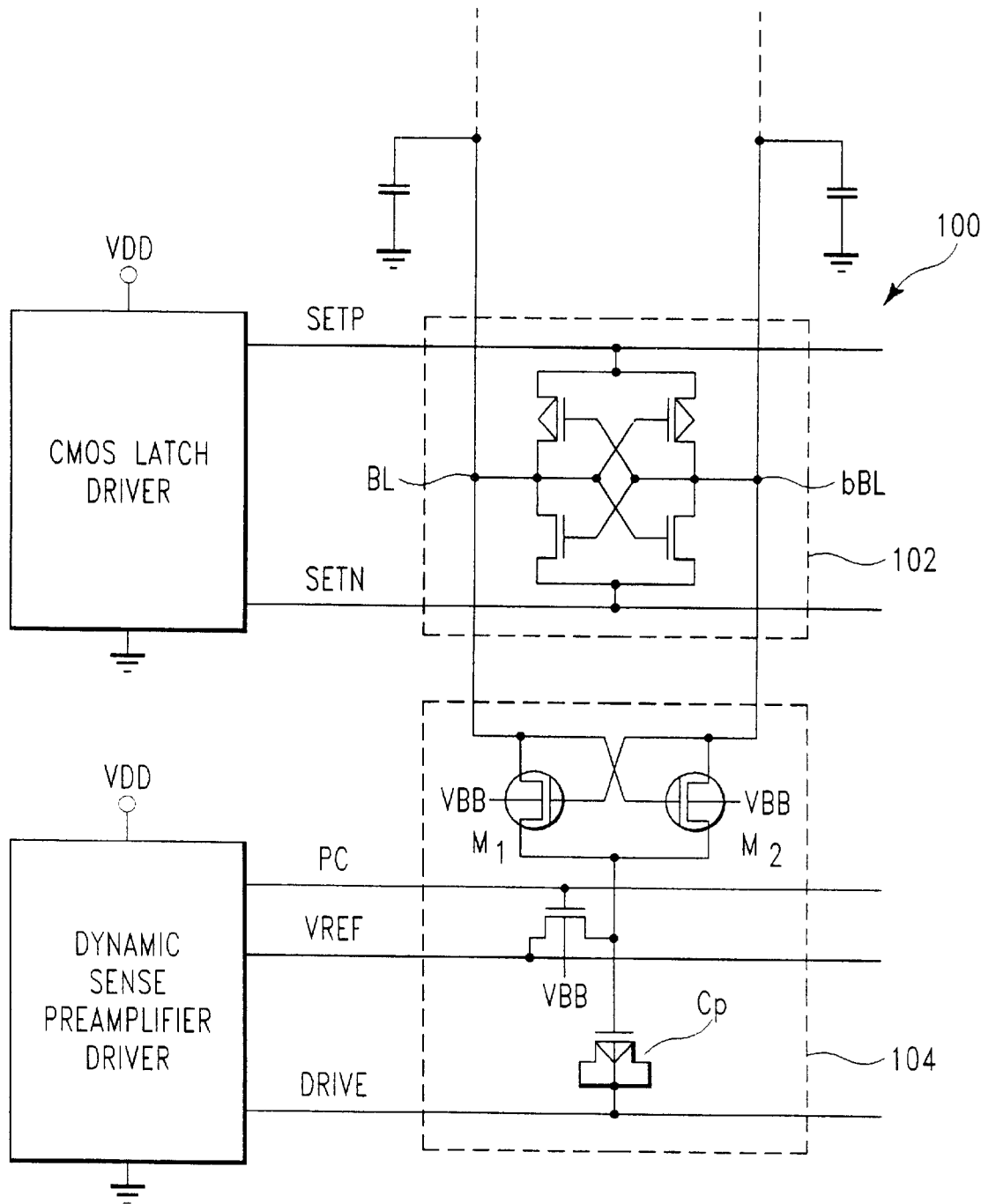
FIG. 13 is an electrical schematic of a dynamic drive CMOS sense amplifier in accordance with one embodiment of the invention.

FIG. 13 illustrates an all CMOS embodiment of a sense amplifier system 100. The sense amplifier system 100 includes a full CMOS latch 102 and a low Vt NMOS sense amplifier 104. In accordance with the invention, the latch 102 and amplifier 104 functions are separated and individually optimized. The CMOS latch 102 serves to drive the bitline, represented by nodes labeled BL and bBL, to the "high" and "low" levels. Signal amplification is done by the low Vt NMOSFET pair M1 and M2. The NMOSFETs M1 and M2 are dynamically driven through a PMOS inversion capacitor Cp. In a signal amplification period, shown by the operation of waveforms of Fig, 15, and before the CMOS latch 102 is activated, the M1 and M2 pair is dynamically driven through the capacitor Cp by a negative going activation signal SADRIVE. The displacement current through the inversion capacitor Cp transiently provides a bias current source for the sense amplifier 104. An important advantage is that the amplifier sources are driven to a negative voltage and not limited to ground as in the case of a conventional sense amplifier. Another advantage is that the amount of bitline preamplification offset is well controlled by the design of the inversion capacitor Cp and the voltage swing of SADRIVE. The bitline offset after preamplification is designed to be just large enough to overcome any CMOS latch mismatches. Therefore, mismatch in the CMOS latch becomes non-critical and can be designed to be all short channel devices for faster drive to the "high" and "low" bitline levels.

Figure 14:
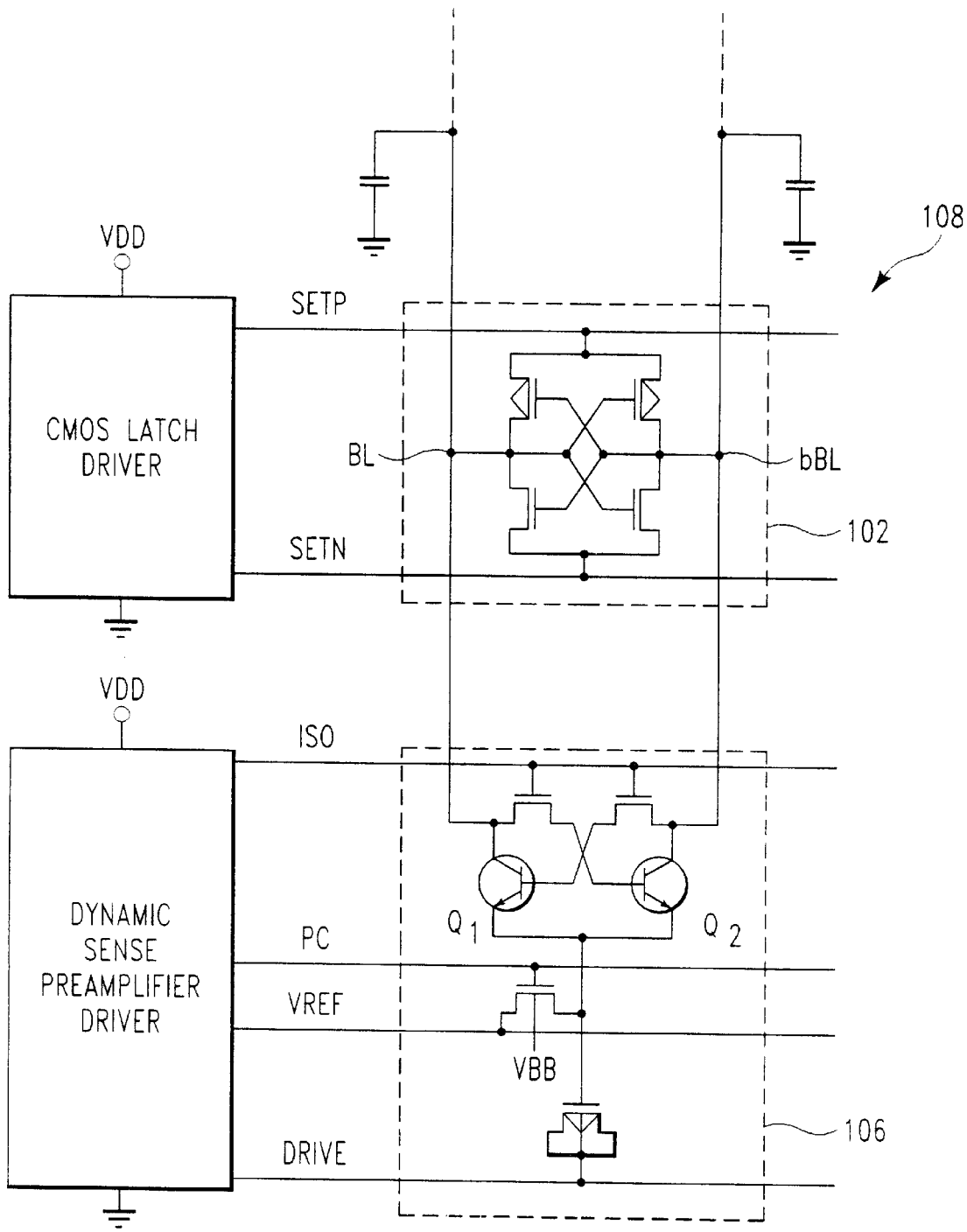
FIG. 14 is an electrical schematic of a dynamic drive bipolar sense amplifier in accordance with another embodiment of the invention.
Figure 15:
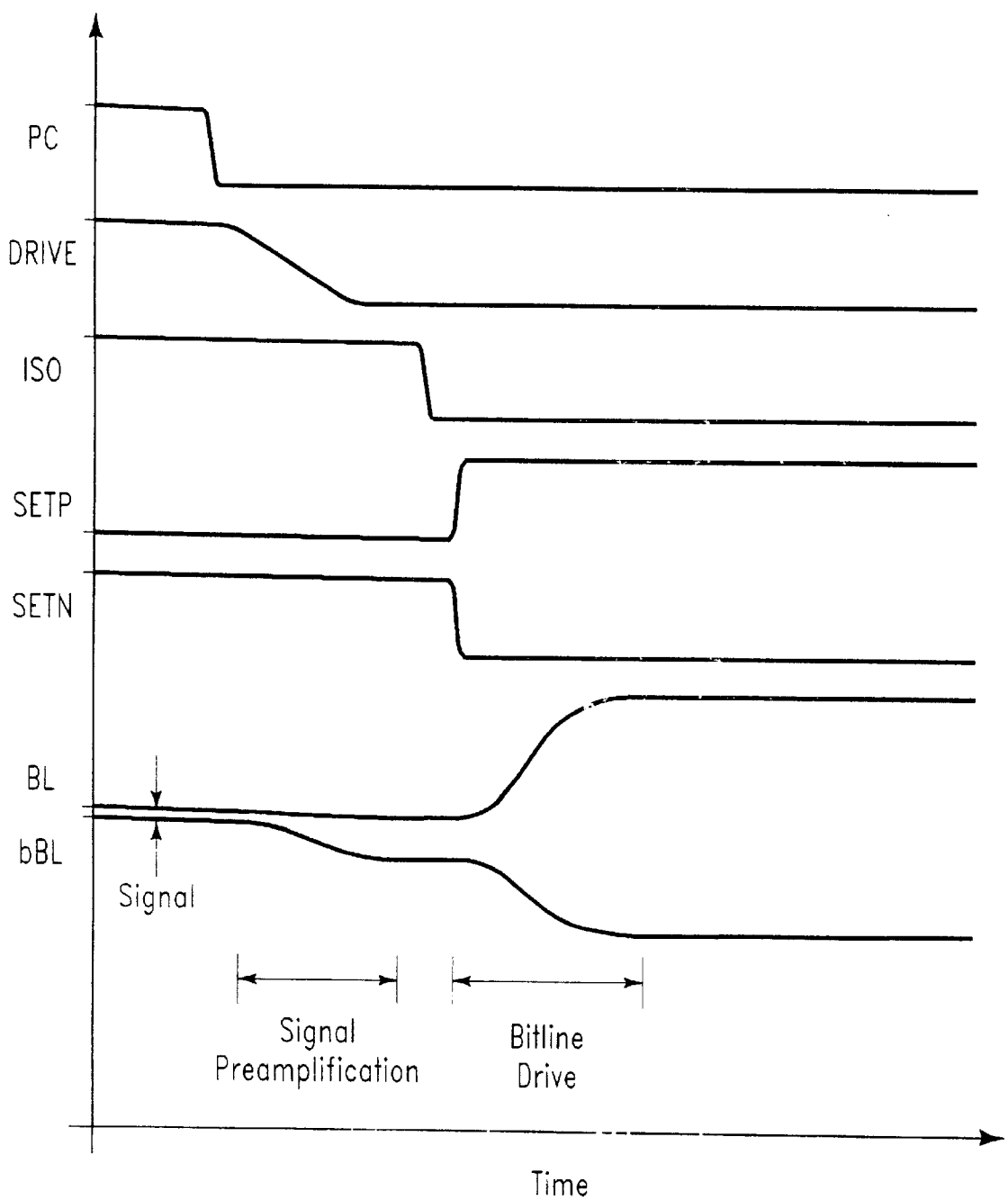
FIG. 15 is a series of waveforms illustrating operation of the sense amplifiers of FIGS. 13 and 14.

Yet another aspect of the novel dynamic drive system is that bipolar NPN transistors can be employed in the sense amplifier 106 shown in a system 108 of FIG. 14. The Vbe drop (typically 0.8V) of the transistors Q1 and Q2 below VBLEQ is overcome by the dynamic drive systems ability to drive below ground. The NPN amplifier 106 yields significant matching advantages over the NMOS version. The NPN Vbe mismatch is well known to be typically 2 mV compared to 20 mV Vt mismatch for the NMOS amplifier and gm matching is much better for bipolar devices. The bipolar sense amplifier 106 of FIG. 14 operates similarly to the CMOS version 104 of FIG. 13, except that it is necessary to isolate the bipolar collector/base junction of the transistors Q1 and Q2 to prevent clamping the bitline high and low difference at a junction forward voltage during setting. Clamping is prevented by NMOS disconnect switches 110 in the cross coupling path. These switches 110 are turned offjust prior to the CMOS latching phase and are controlled by the ISOSA signal shown in FIG. 15.

Thus in accordance with the invention, there is illustrated a structure and method for novel SOI DRAM BICMOS NPN processing and a DRAM bitline sense system with dynamic drive sense amplifiers and a CMOS latch.

We claim:

1. A method of simultaneously processing array and bipolar areas on a silicon on insulator (SOI) substrate for forming array devices and bipolar devices on the SOI substrate, comprising the steps of:
   a) providing an SOI substrate having areas thereon to be processed as array regions and other areas thereon to be processed as bipolar regions;
   b) forming electrically isolated silicon regions in the SOI substrate including array silicon in the array regions and bipolar silicon in the bipolar regions;
   c) blocking the array silicon including forming a first type dopant collector layer in the bipolar silicon and a base layer in the bipolar silicon on the collector layer;
   d) unblocking the array silicon and forming a blocking layer on the bipolar silicon including well implanting a second type dopant into the array silicon;
   e) forming a dielectric layer on the array silicon;
   f) simultaneously forming a gate layer over the array silicon and over the bipolar silicon;
   g) forming a cover layer over the gate layer;
   h) removing the gate layer and the cover layer, except from over a portion of the each array silicon in the array regions;
   i) forming sidewall spacers on the gate layer and the cover layer on the portion of each array silicon in the array regions;
   j) removing the blocking layer on the bipolar silicon and masking a portion of each bipolar silicon region;
   k) simultaneously implanting the first type dopant into the array silicon that is not blocked by the cover layer and sidewall spacers for forming diffusing regions on opposite sides of the gate layer, and into the bipolar silicon that is not masked for forming collector contacts for the collector layer in the bipolar silicon; and
   l) forming an emitter layer on the base layer.

2. The method of claim 1 wherein the step of forming a first type dopant collector layer in the bipolar silicon and a base layer in the bipolar silicon on the collector layer produces a narrow base width limited by SOI thickness.

3. The method of claim 1 wherein the step of forming a first type dopant collector layer in the bipolar silicon and a base layer in the bipolar silicon on the collector layer comprises terminating the collector layer on back oxide of the bipolar region to reduce collector to substrate capacitance.

4. A method of simultaneously processing array and bipolar areas on a silicon on insulator (SOI) substrate, comprising the steps of:
   a) providing an SOI substrate having areas thereon to be processed as array regions and other areas thereon to be processed as bipolar regions;
   b) forming electrically isolated silicon regions in the SOI substrate including array silicon in the array regions and bipolar silicon in the bipolar regions;
   c) blocking the array silicon including forming a first type dopant collector layer in the bipolar silicon and a base layer in the bipolar silicon on the collector layer;
   d) unblocking the array silicon and forming a blocking layer on the bipolar silicon including well implanting a second type dopant into the array silicon;
   e) forming a dielectric layer on the array silicon;
   f) simultaneously forming a gate layer over the array silicon and over the bipolar silicon;
   g) forming a cover layer over the gate layer;
   h) removing the gate layer and the cover layer, except from over a portion of the each array silicon in the array regions;
   i) forming sidewall spacers on the gate layer and the cover layer on the portion of each array silicon in the array regions;
   j) removing the blocking layer on the bipolar silicon and masking a portion of each bipolar silicon region;
   k) simultaneously implanting the first type dopant into the array silicon that is not blocked by the cover layer and sidewall spacers for forming diffusing regions on opposite sides of the gate layer, and into the bipolar silicon that is not masked for forming collector contacts for the collector layer in the bipolar silicon;
   l) simultaneously forming an inter level dielectric (ILD) layer over the array silicon and over the bipolar silicon, including forming a mask layer on the ILD layer;
   m) forming openings at least through the mask layer down to the array silicon and the sidewall spacers in the array regions, and down to the base layer in the bipolar regions; and
   n) depositing silicon in the openings down to the array silicon in the array regions for forming array access lines in the array regions and down to the base layer in the bipolar regions for forming emitters.

5. The method of claim 4 wherein the step of forming a first type dopant collector layer in the bipolar silicon and a base layer in the bipolar silicon on the collector layer produces a narrow base width limited by SOI thickness.

6. The method of claim 4 wherein the step of forming a first type dopant collector layer in the bipolar silicon and a base layer in the bipolar silicon on the collector layer comprises terminating the collector layer on back oxide of the bipolar region to reduce collector to substrate capacitance.

7. A method of simultaneously processing array and bipolar areas on a silicon on insulator (SOI) substrate, comprising the steps of:
   a) providing an SOI substrate having areas thereon to be processed as array regions and other areas thereon to be processed as bipolar regions;

b) forming electrically isolated silicon regions in the SOI substrate including array silicon in the array regions and bipolar silicon in the bipolar regions;

c) blocking the array silicon including forming a first type dopant collector layer in the bipolar silicon and a base layer in the bipolar silicon on the collector layer;

d) unblocking the array silicon and forming a blocking layer on the bipolar silicon including well implanting a second type dopant into the array silicon;

e) forming a dielectric layer on the array silicon;

f) simultaneously forming a gate layer over the array silicon and over the bipolar silicon;

g) forming a cover layer over the gate layer;

h) removing the gate layer and the cover layer, except from over a portion of the each array silicon in the array regions;

i) forming sidewall spacers on the gate layer and the cover layer on the portion of each array silicon in the array regions;

j) removing the blocking layer on the bipolar silicon and masking a portion of each bipolar silicon region;

k) simultaneously implanting the first type dopant into the array silicon that is not blocked by the cover layer and sidewall spacers for forming diffusing regions on opposite sides of the gate layer, and into the bipolar silicon that is not masked for forming collector contacts for the collector layer in the bipolar silicon;

l) simultaneously forming an inter level dielectric (ILD) layer over the array silicon and over the bipolar silicon, including forming a mask layer on the ILD layer;

m) forming openings at least through the mask layer down to the array silicon and the sidewall spacers in the array regions, and down to the base layer in the bipolar regions; and n) implanting second type dopant through the openings into the array silicon for forming diffusion regions on opposite sides of the gate layer, and into the base layer for forming base contacts.

8. The method of claim 7 further comprising the steps of:

o) forming additional openings at least through the mask layer down to the base layer including disposing silicon in the additional openings for forming emitters on the base layer; and p) annealing the bipolar silicon for diffusing the emitters into the base layer.

9. The method of claim 7 wherein the step of forming a first type dopant collector layer in the bipolar silicon and a base layer in the bipolar silicon on the collector layer produces a narrow base width limited by SOI thickness.

10. The method of claim 7 wherein the step of forming a first type dopant collector layer in the bipolar silicon and a base layer in the bipolar silicon on the collector layer comprises terminating the collector layer on back oxide of the bipolar region to reduce collector to substrate capacitance.

11. A method of operating a bitline sense amplifier system including true and complement bitlines coupled to true and complement bitline sense amplifier nodes, comprising:

connecting a dynamic sense preamplifier between said nodes;

operating the dynamic sense preamplifier in a first amplification signal phase;

connecting a CMOS latch between said nodes; and operating the CMOS latch in a second bitline amplifying phase.

12. The method of claim 11 wherein a capacitor displacement current provides a source of bias current to the dynamic sense preamplifier.

* * * * *